United States Patent [19]

Levesque et al.

[11] Patent Number: 4,794,623
[45] Date of Patent: Dec. 27, 1988

[54] RECOVERY OF CARRIER SIGNAL FROM QAM DOUBLE SIDEBAND SUPPRESSED CARRIER IF SIGNAL FOR USE IN SYNCHRONOUS DEMODULATION

[75] Inventors: Louis Y. Levesque, Salem; Mitchell A. Skinner, Hampton, both of N.H.

[73] Assignee: AT&T Telephone and Telegraph Company, AT&T Bell Laboratories, Murray Hill, N.J.

[21] Appl. No.: 63,703

[22] Filed: Jun. 12, 1976

Related U.S. Application Data

[63] Continuation of Ser. No. 788,454, Oct. 17, 1985, abandoned.

[51] Int. Cl.[4] .............................................. H03D 3/22
[52] U.S. Cl. ........................................ 375/86; 375/39; 375/81; 329/122
[58] Field of Search ........................ 375/80, 81, 82, 83, 375/119, 120, 39, 77; 329/50, 104, 122, 124; 331/1 A, 1 R; 455/258, 259, 260

[56] References Cited

U.S. PATENT DOCUMENTS

| | | | |
|---|---|---|---|
| 3,518,680 | 6/1970 | McAuliffe | 375/39 |
| 3,984,778 | 10/1976 | Bhopale | 375/77 |
| 4,021,752 | 5/1977 | Sato et al. | 455/260 |
| 4,027,274 | 5/1977 | Fukui et al. | 375/120 |
| 4,110,557 | 8/1978 | Huber | 375/120 |
| 4,143,322 | 3/1979 | Shimamura | 325/320 |
| 4,166,979 | 9/1979 | Waggener | 375/120 |
| 4,320,345 | 3/1982 | Waggener | 329/50 |
| 4,361,894 | 11/1982 | Kurihara | 375/80 |
| 4,380,815 | 4/1983 | Clendening | 375/81 |
| 4,387,342 | 6/1983 | Grosjean | 375/120 |
| 4,409,562 | 10/1983 | Kurihara | 331/1 A |
| 4,419,760 | 12/1983 | Bjornholt | 375/120 |
| 4,466,109 | 8/1984 | Saari | 375/86 |
| 4,495,473 | 1/1985 | Treise | 375/120 |
| 4,547,736 | 10/1985 | Takeda | 375/81 |
| 4,569,064 | 2/1986 | Collin et al. | 375/120 |
| 4,590,602 | 5/1986 | Wolaver | 375/82 |
| 4,591,797 | 5/1986 | Tanimoto et al. | 375/81 |

OTHER PUBLICATIONS

Bronstein, "Improved Phase-Lock Detector", NASA Tech Briefs, Lyndon B. Johnson Space Center, Houston, Texas, Spring 1981.

Primary Examiner—Robert L. Griffin
Assistant Examiner—Stephen Chin
Attorney, Agent, or Firm—David R. Padnes

[57] ABSTRACT

A novel circuit recovers a carrier signal from a 16 or 64 QAM double sideband suppressed carrier IF signal for use in synchronolus demodulation. A 70 MHz IF signal is fed to a power splitter for distributing the signals to a demodulator and to a quadrupler. The 280 MHz signal from the quadrupler is fed to a surface acoustic wave filter to extract the components of the double sideband suppressed carrier signal and the output therefrom is amplified prior to being divided by four to recover the 70 MHz signal. The 70 MHz signal is delivered to a phase frequency detector which provides an error signal during acquisition to deviate a VCO toward the received frequency and thus obtain very fast acquisition time. When the VCO is locked, the phase frequency detector is disconnected from the summing node of a PLL, and a correlated error polarity adaptive carrier recovery circuit operates the demodulator.

14 Claims, 1 Drawing Sheet

RECOVERY OF CARRIER SIGNAL FROM QAM DOUBLE SIDEBAND SUPPRESSED CARRIER IF SIGNAL FOR USE IN SYNCHRONOUS DEMODULATION

This application is a continuation, of application Ser. No. 788,454, filed Oct. 17, 1985 now abandoned.

TECHNICAL FIELD

This invention relates to the recovery of carrier signals and, in particular, to the recovery of a carrier signal from a QAM double sideband suppressed carrier IF signal for use in synchronous demodulation.

BACKGROUND OF THE INVENTION

A circuit for the recovery of a carrier signal uses a sweep oscillator. The acquisition time of the sweep circuit is limited by the sweep frequency and the capability of a phase locked loop to respond to it. Typically, the acquisition time is about fifty milliseconds. It is desirable to obtain a faster acquisition time when the phase locked loop is out of lock.

SUMMARY OF THE INVENTION

Broadly speaking, the present invention provides faster acquisition of a locally-generated carrier signal from a received signal by utilizing the sum of two error signals to adjust the frequency and phase of the carrier signal generator. One of these error signals is produced in response to the received signal and the other is generated in response to the demodulated received signal. In accordance with the disclosed embodiment of the present invention, the above technique is accomplished by dividing the received signal into two components. One component is processed, using frequency translators, filters and amplifiers, to derive the first error signal. The second error signal is formed by demodulating the second component, recovering the baseband data and then correlating this data. Once the carrier signal generator is locked, the first error signal is not used.

DETAILED DESCRIPTION

Figure 1:
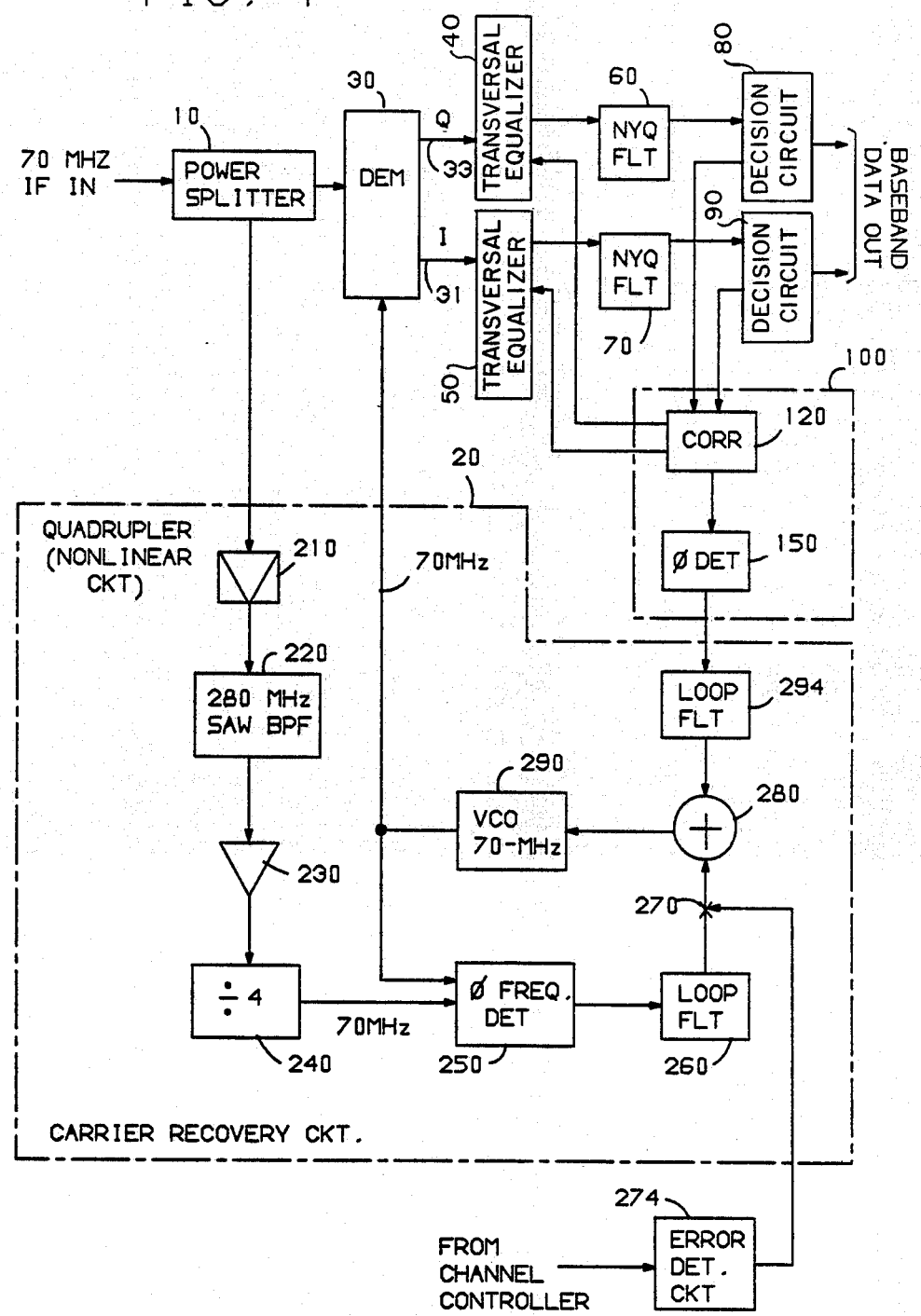
FIG. 1 shows a receiver using the carrier recovery circuit embodying the present invention.

Referring to FIG. 1 of the drawing, there is shown a 70 MHz QAM double sideband suppressed carrier IF signal being delivered to a power splitter 10. The output signals from power splitter 10 are delivered to carrier recovery circuit 20 and to demodulator 30. The in-phase signal from demodulator 30 is delivered via I rail 31 to transversal equalizer 50. The quadrature output signal from demodulator 30 is delivered via Q rail 33 to transversal equalizer 40. The output signals from transversal equalizers 50 and 40 are delivered, respectively, via Nyquist filters 70 and 60 to decision circuits 90 and 80. The data output signals at baseband are generated from decision circuits 90 and 80. One output signal from each decision circuit is fed to digital frame processing circuits (not shown). The other output signal from each decision circuit is fed to correlator 120 within correlated error polarity circuit 100.

Three output signals are generated from correlator 120. Two of these output signals are fed back to transversal equalizers 50 and 40 for adaptive adjustment of tapped delay lines therewithin. The other output from correlator 120 is delivered to phase detector 150 to correct for phase error.

The correlated error polarity signal from the output of phase detector 150 is delivered to loop filter 294 within carrier recovery circuit 20. Loop filter 294 passes a relatively narrow band signal of about 15 KHz to summer 280.

The other output signal from power splitter 10 is delivered to quadrupler 210 within carrier recovery circuit 20. Quadrupler 210 includes an amplifier and may be, for example, an AK-2 or a SK-2 frequency doubler, made by Mini-Circuits of Brooklyn, N.Y. The 280 MHz signal, which is the fourth harmonic of the carrier signal, from quadrupler 210 is delivered to a surface acoustic wave (SAW) band pass filter 220. One such surface acoustic wave filter is disclosed in a book entitled, "Acoustic Surface Waves" edited by A. A. Oliver, published in 1978 by Springer-Verlag, Berlin. SAW filter 220 replaces discrete components which could not function effectively at 280 MHz. Further, because SAW filter 220 passes a band of about 4 MHz, jitter performance is improved substantially.

The output from SAW filter 220 is amplified by device 230 to at least 500 mV for safe division by four at divide by four circuit 240 to derive a 70 MHz signal. Divide by four circuit 240 may be a MC1699 made by Motorola, Inc., Phoenix, Ariz. 85036.

The 70 MHz output signal from divide by four circuit 240 is delivered as one of the two input signals to phase frequency detector 250. The other input to phase frequency detector 250 is the output from voltage controlled oscillator 290. Phase frequency detector 250 may be a MC12040 device made by Motorola, Inc., Phoenix, Ariz. Phase frequency detector 250 functions primarily as a frequency detector. A correcting voltage from phase frequency detector 250 is delivered to loop filter 260 which passes a narrow band of about 15 KHz. The correcting signal from loop filter 260 is delivered to summer 290 via switch 270.

Switch 270 may be a FET and remains disconnected normally. When an error is detected at error detection circuit 274, switch 270 is turned on. For example, if switch 270 is a FET, a signal from error detection circuit 274 to the gate of the FET (not shown) wil turn it on. When switch 270 is turned on, the correcting signal from loop filter 260 will be summed at element 280 with the output from filter 294 and the summed signal will be used to adjust voltage controlled oscillator 290. The output from voltage controlled oscillator 290 is then delivered to phase frequency detector 250 and to demodulator 30. After voltage controlled oscillator 290 is locked in phase and frequency, error detection circuit 274 will no longer keep switch 270 turned on.

What is claimed is:
1. A method for recovering a carrier signal from a double sideband suppressed carrier signal comprising the steps of
splitting said double sideband suppressed carrier into first and second signals,
delivering said first signal to a quadrupler,
filtering the output signal from said quadrupler,
amplifying the filtered signal,
dividing said amplified and filtered signal to derive a second carrier signal,
delivering said second carrier signal to a phase frequency detector to derive a first error signal,
filtering said first error signal from said phase frequency detector, summing said filtered first error signal with a second error signal received from a correlated error polarity circuit, and adjusting an oscillator with the summed signal.

2. The method of claim 1 further comprising the step of disconnecting said first error signal from said summing step after said oscillator has locked.

3. A circuit for recovering a carrier signal from a double sideband suppressed carrier signal, said circuit comprising an oscillator, a power splitter for delivering said carrier signal to a demodulator and to a quadrupler, a filter, connected to the output of said quadrupler, for passing an output signal having a predetermined bandwidth, means for amplifying the output signal from said filter prior to delivery to a divide by four circuit, means for detecting the difference in frequency between the output signal from said oscillator and said divide by four circuit to produce a first error signal, means for filtering said first error signal, and means for summing said filtered first error signal with a second error signal from a correlated error polarity circuit to derive a summed signal for adjusting said oscillator.

4. The circuit of claim 3 further comprising means for disconnecting said filtered first error signal from said summing means after said oscillator has locked.

5. A method of recovering a carrier signal from a modulated incoming signal, said method comprising the steps of:

generating a periodic reference signal;

demodulating said incoming signal;

generating a first error signal in response to the demodulated incoming signal, said first error signal having nonzero values at certain times;

generating a second error signal in response to said modulated incoming signal, said second error signal having nonzero values at said certain times; and generating a control signal which drives said periodic reference signal into phase alignment with said carrier signal, said phase alignment occurring when said periodic reference signal and said carrier signal are at the same frequency and have no phase difference and said control signal being generated in response to the nonzero values of both said first and second error signals at each certain time.

6. A circuit for recovering a carrier signal from a modulated incoming signal, said circuit comprising means for generating a periodic reference signal;

means for demodulating said incoming signal;

means responsive to the demodulated incoming signal for generating a first error signal having nonzero values at certain times;

means responsive to said modulated incoming signal for generating a second error signal having nonzero values at said certain times; and means responsive to the nonzero values of both said first and second error signals at each certain time for driving said periodic reference signal into phase alignment with said carrier signal, said phase alignment occurring when said periodic reference signal and said carrier signal are at the same frequency and have no phase difference.

7. The apparatus of claim 6 wherein said periodic reference signal generating means adjusts said demodulating means.

8. The apparatus of claim 6 wherein said first error signal generating means includes correlation means.

9. The apparatus of claim 6 wherein said second error signal generating means includes frequency translation means.

10. The apparatus of claim 6 wherein said first and second error signal generating means generate their respective error signals independently of each other.

11. The apparatus of claim 6 further including means for disconnecting said second error signal generating means from said driving means in response to preselected criterion.

12. The circuit of claim 6 wherein said modulated incoming signal conveys information and said demodulating means forms data signals from said incoming modulated signal, each data signal conveying a portion of the information in said modulated carrier signal.

13. The circuit of claim 6 wherein said modulated incoming signal is of a modulated suppressed carrier signal in which there is no signal energy present at the carrier frequency and said second error signal generating means forms a signal at the carrier frequency and generates said second error signal therefrom.

14. The circuit of claim 12 wherein said first error signal generating means generates said first error signal in response to a correlation of said data signals with each other.

* * * * *